(12) United States Patent
Pereira

(10) Patent No.: US 7,215,535 B2
(45) Date of Patent: May 8, 2007

(54) MODULAR POWER DISTRIBUTION SYSTEM FOR USE IN COMPUTER EQUIPMENT RACKS

(75) Inventor: Robert A. Pereira, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 262 days.

(21) Appl. No.: 10/995,737

(22) Filed: Nov. 22, 2004

(65) Prior Publication Data

US 2005/0068716 A1 Mar. 31, 2005

Related U.S. Application Data

(63) Continuation of application No. 10/185,530, filed on Jun. 28, 2002, now Pat. No. 6,826,036.

(51) Int. Cl.
*H02B 1/04* (2006.01)

(52) U.S. Cl. .................. 361/624; 174/59; 361/648
(58) Field of Classification Search .................. None
See application file for complete search history.

(56) References Cited

U.S. PATENT DOCUMENTS

| | | | |
|---|---|---|---|
| 4,787,011 A | 11/1988 | Stanfield et al. | |
| 5,065,141 A * | 11/1991 | Whitsitt | 340/635 |
| 5,821,636 A * | 10/1998 | Baker et al. | 307/70 |
| 6,078,503 A | 6/2000 | Gallagher et al. | |
| 6,169,249 B1 | 1/2001 | Teachout et al. | |
| 6,229,691 B1 | 5/2001 | Tanzer et al. | |
| 6,301,095 B1 * | 10/2001 | Laughlin et al. | 361/624 |
| 6,331,933 B1 | 12/2001 | Rumney | |
| 6,826,036 B2 * | 11/2004 | Pereira | 361/624 |
| 6,937,461 B1 * | 8/2005 | Donahue, IV | 361/622 |
| 6,967,283 B2 * | 11/2005 | Rasmussen et al. | 174/50 |

* cited by examiner

*Primary Examiner*—Greg Thompson

(57) ABSTRACT

A modular power distribution system is provided for distributing power within an equipment rack. One particular power distribution system has a control unit that is mounted proximate a rack including a power input for receiving power from a power source located outside the rack. The control unit includes a power converter for converting the received power to an output electrical power, and a plurality of power outlets for providing an electrical connection to the control unit and outputting the output electrical power. This particular power distribution system also includes an extension means mounted proximate the rack and having an electrical power input for input of electrical power to the extension means and a plurality of power outlets adapted to couple with and distribute electrical power to conducting elements that electrically connect the extension means to the mounted equipment. This particular power distribution system further includes an electrical power cable connected to one of the power outlets in the control unit and to the electrical power input of the extension means.

20 Claims, 6 Drawing Sheets

MODULAR POWER DISTRIBUTION SYSTEM FOR USE IN COMPUTER EQUIPMENT RACKS

PRIORITY

This patent application is a continuation of, and claims priority from, a patent application Ser. No. 10/185,530 titled "Modular Power Distribution System For Use In Computer Equipment Racks" filed Jun. 28, 2002 now U.S. Pat. No. 6,826,036.

BACKGROUND OF THE INVENTION

1. Field of the Invention

The present invention relates, in general, to power distribution and distribution systems, and more particularly, to a modular power distribution unit for use in distributing power within the limited space of an equipment cabinet or rack, such as a computer equipment rack or a data storage cabinet.

2. Relevant Background

In the computer industry, mass storage systems and other computer systems typically include numerous multi-shelf cabinets or racks each holding multiple devices or encloses, such as servers, disk drives, and other computer devices. These racks or rack systems are ideal for modular projects and are designed to accept standard sized devices having relatively standard power requirements and communication connections. Generally, the outer case includes an aluminum or steel framework fitted with covers and a series of connectors at the rear from which the devices or modules derive their power and exchange communication signals. The individual modules include a supporting chassis or housing that slides into the rack and is supported on guides, such as clip-in glides. Racks and rack systems are inherently flexible but are often expensive which drives users and rack makers to efficiently use space within the rack or cabinet.

Each rack or cabinet typically only has a limited amount of space that is defined by or urged into shelves. The shelves or shelf locations are configured to allow a device enclosure or module or other components to be plugged into and supported within the rack. Typical rack configurations call for 14 shelves although more shelves may be provided such as up to 24 or more shelves. If shelves are arranged vertically, a typical cabinet may have 14, 24, 32, or some other number of shelves that each occupy a certain amount of rack space, such as 3 retma(U) which is a standard mounting unit increment.

In practice, such as data centers, data storage, and the like, the racks are often densely packed with devices, such as servers each requiring a primary power supply and a backup power supply for redundancy. For example, one arrangement uses up to 14-3U server enclosures in a rack requiring up to 28–750 watt power supplies. In another rack configuration, 21-2U servers are installed in a rack with 42–500 watt primary and redundant power supplies. A major challenge facing rack and equipment designers is how best to serve dense equipment users so as to provide increased power distribution while efficiently using the space within the rack to reduce cable clutter and connection and supply confusion. In other words, it is desirable to reduce the amount of space required for power distribution units (PDUs) (e.g., typically, a plurality of electrical receptacles to which electrical plugs of power cords can be connected and which are supplied by an inlet A/C power source) and power cords from the PDUs to the devices on the rack shelves to thereby free up rack U-space for more modules or enclosures.

Existing forms of power distribution require large volumes of cabinet or rack space as numerous PDUs are provided and often mounted in the rack that reduces the available shelves or U-space for computer or other desired components. For example, current PDU support requirements often call for as many as four to six 24 amp PDUs per rack, which leads to some rack configurations being limited when a maximum number of PDUs have been installed in the rack In addition to the space required for the PDUs, large volumes of rack space may be required for the large number of power cords and other devices required to connect the PDUs to the individual devices or loads on the shelves. Often, an enclosure or device is located on a shelf which is relatively distant from the closest PDU which requires a long power cord to be snaked through the rack to the enclosure or device. The number of the cables and PDUs increases deployment complexity and can cause connection problems and mistakes. Additionally, after installation is completed, later expansions or modifications to the rack and power distribution arrangements are difficult to successfully implement.

Hence, there remains a need for an improved method and system for distributing power within an equipment rack or cabinet that requires less U-space, reduces the number and lengths and cost of connecting power supply cords used in racks (Le., provides improved cable or cord management), is simple to customize, to install, and upgrade or later modify, and reduces the total deployment cost.

SUMMARY OF THE INVENTION

The present invention addresses the above discussed and additional problems by providing a modular power distribution system for use in distributing power to devices, modules, and/or enclosures mounted within equipment racks or cabinets. The power distribution system includes two basic building blocks: a core or control unit and one or more (and, typically 2 or 4) extension sticks or bars. The modular architecture allows a rack designer to custom configure a rack power distribution system based on their particular computer or other equipment needs and power availability, which minimize cable clutter and confusion and increases available rack space.

Generally, the modular power distribution system concentrates central features of typical power distribution systems (e.g., a main power switch, circuit breakers, load groups, and power-on indication) into the core unit that is configured to be mounted at a remote location within the rack or cabinet enclosure. The housing of the core unit is this, such as 1U or less, and include clips orb for mounting vertically on a side of the rack (e.g., a OU mounting) or horizontally (e.g., a 1U or less mounting). The extension bars include a number (e.g., 1 to 8 connections are provided in some embodiments) of AC power outlets, receptacles, connectors, cord segments, or other devices for connecting enclosures, modules, or devices in the rack to a power source. The extension bars include clips or other fasteners for mounting onto one corner support of the rack which avoids using rack U-space for the extension bars while also enabling positioning of the bars at nearly any height within the rack and typically, near the rack positions or shelves of the devices being powered to reduce the need for long lengths of power supply cords and extend outlets along the entire or any desired portion of the length of the rack.

In operation, the core unit provides protected outputs that feed power to multiple high current outlets in the extension bars that can be used for connecting the high current loads, e.g., the enclosures, modules, or devices mounted on the shelves of the rack, to an acceptable power supply or source. The extension bars each connect directly to the core unit via a flexible power supply cord. The extension bars effectively locate the "fanning out" of the AC power in the rack closer to the loads and eliminates many power supply cords that were required in previous distribution arrangements. A wide range of capacities may be provided according to the invention (such as 16 to 40 amps devices) and numerous outlets may be provided in each modular power distribution system, such as 32 outlets with the used of 4 extension bars each having 8 AC power outlets (which in turn may be any of several industry standard connector families or be short power leads that connect directly to the load when it is desired to eliminate power cords).

More particularly, a power distribution system is provided for distributing power to electrical or computer equipment in an equipment rack. The system includes a control unit mounted within the rack having a power input electrically connected to a power source (such as with a cable or hardened to an AC power source or facility source) and a converter for converting the input power from the source to a power supply required by the rack equipment The control unit includes a housing on which a plurality of power outlets or connections are mounted for providing an electrical connection to the control unit and for distributing the converted power supply to the equipment An extension bar is mounted within the rack typically adjacent one of the corner supports of the rack. The extension bar includes a power inlet and is connected via an electrical conductor or power cord to one of the power outlets of the control unit The extension bar includes a number of power outlets (such as up to or more than 8) adapted for electrical connection to power supply lines (cords or hardwiring) from the rack equipment The control unit housing typically includes one or more brackets for rigidly mounting the housing to the corner supports of the rack. In some embodiments, the control unit is mounted vertically in a OU mounting with the thin (i.e., less than about 1U) cross-section of the housing positioned between two adjacent corner supports. In other embodiments, the control unit is mounted horizontally in a less than 1U mounting with the thin cross-section of the house position horizontally between the corner supports.

BRIEF DESCRIPTION OF THE DRAWINGS

FIG. 6 is functional block diagram of equipment in a rack illustrating the use of a pair of control units of the invention to provide primary and secondary or backup power to four enclosures, such as servers; and.

DETAILED DESCRIPTION OF THE PREFERRED EMBODIMENTS

The present invention is directed toward modular power distribution systems for use in equipment racks, such as those typically utilized in the computer and data storage industries, and rack designs incorporating such modular systems. The modular systems are unique in utilizing two building blocks to allow ready field configuration and placement of power outlets within a rack. The first building block is control unit that provides the connecting point to a power supply outside the rack and includes a number of control and distribution components such as main power switch, circuit breakers, load groups, and remote power monitoring and management (such as via a network like the Internet or other communication network). The control unit has a thin housing with mounting brackets that allow the unit to be mounted either in a vertical or side mounting in the rack ("a OU mounting") that does not use any rack space or a horizontal or in rack mounting ("a 1U mounting") that uses a small portion of the rack space. The second building block is a set (e.g., 1 to 4 or more) of extension bars or sticks that are connected to the control unit and include a number (such as 1 to 8 or more) of power outlets, receptacles, and the like to distribute power to numerous locations in the rack. Similar to the control unit, the extension bars include housings with clips or brackets that allow the extension bars to be mounted on vertical structural members (e.g., corner supports) of the rack at varied heights to place the outlets near the rack loads, e.g., enclosures, modules, and other rack-mounted devices and equipment The modular system address the problem of cable management by significantly reducing the number of cords and cables required and reducing the lengths of cables in the rack which improves cooling in the rack and frees up additional rack U-space.

Figure 1:
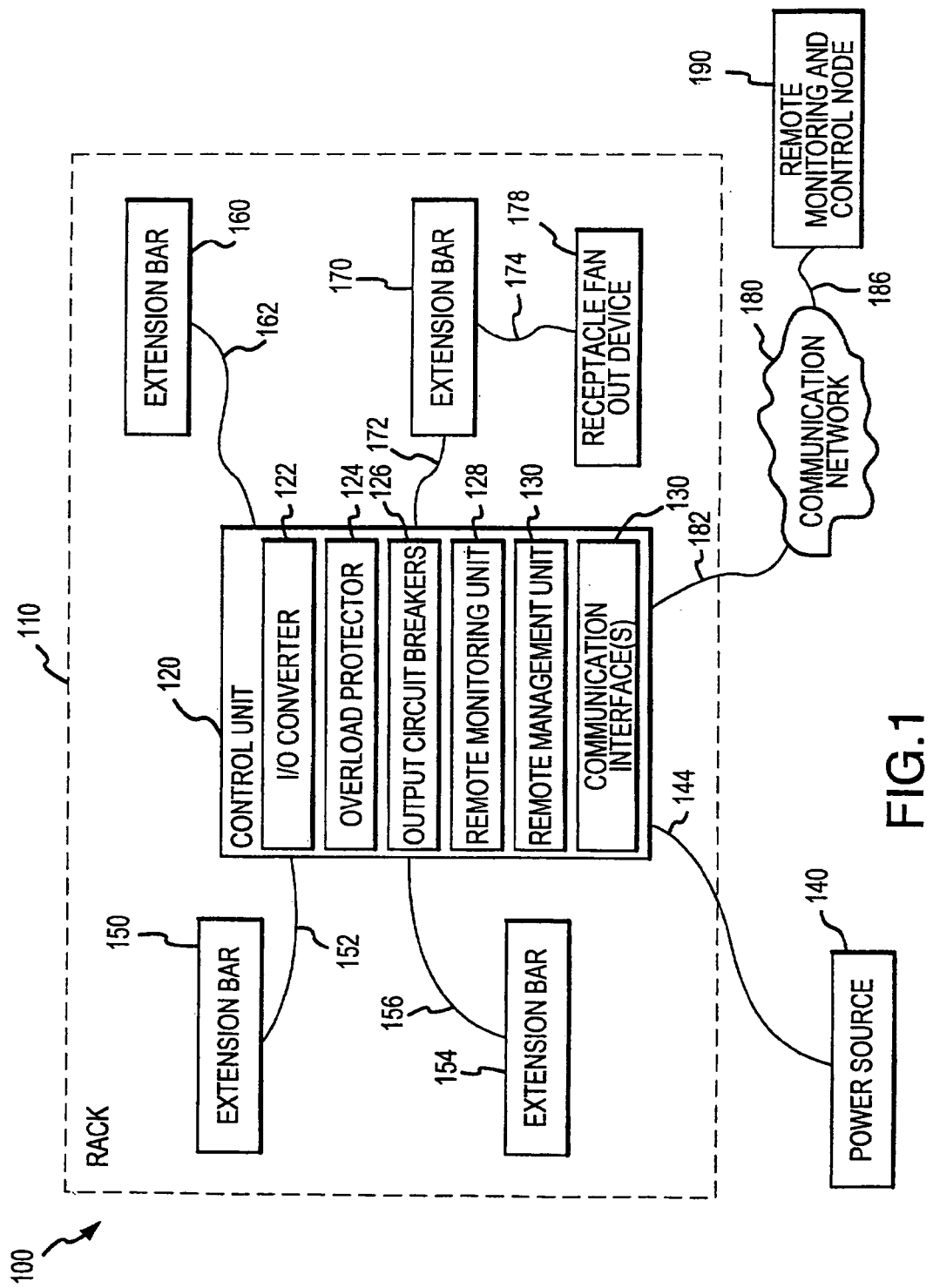
FIG. 1 is a functional block diagram of a modular power distribution system according to the present invention.

More specifically, FIG. 1 illustrates a modular power distribution system 100 in functional block form as the system 100 may be integrated into an equipment rack 110. The equipment rack 110 may be any of a number of widely available equipment racks used in the computer and electronics industry, such as the Compaq Rack 9000 and 10000 Series. The rack 110 generally includes space or shelves on or in which equipment modules or enclosures are positioned, with an industry standard being 3 retmas equaling 1U. An important design configuration form any racks is attempting to utilize all or most of the rack U-space or shelves with functional equipment (such as computer servers, controllers, and the like) and not with support or peripheral equipment, such as power distinction devices and power supply cables.

With this space requirement in mind, the power distribution system 100 includes a cool or core unit 120 which centralizes numerous power distribution, power distribution and load monitoring, and control functions within a single device and includes one or more power supply sticks or extension devices that provide power from the control unit 120 to a number of loads or enclosures (not shown in FIG. 1) mounted throughout the rack 110. As will be discussed with reference to FIGS. 2–5, the control unit 120 typically includes a relatively small housing (such as IU or less thickness) and mounting brackets compatible with standard racks 110. The combination of small size and mounting bits allows the control unit 120 to be mounted in numerous locations within the rack 110 in a vertical or side arrangement ("0U mounting) between two corner supports of the rack 110 that takes no or little rack U-space or in a horizontal or shelf arrangement ("1U mounting") that takes only 1U or less of rack U-space.

The control unit 120 provides a power supply function within the rack 110. The unit 20 is connected to power source 140 by power cord or cable 144. The control unit 120 functions to brings power into the rack 110 from power source 140 (e.g., any of numerous power sources used in the computer equipment and data storage industries) and then converts the power removed from power source 140 to a power supply useful or demanded by loads in the rack 110. To this end, the control unit 120 includes converter 22 to convert the input power (such as 30 to 50 amp AC) on cable 144 for distribution on power supply cables 152, 156, 162, 172 to extension bars 150, 154, 160, 170.

The control unit 120 provides protected outputs that feed power via the converter 122 to multiple current outlets (typically, high current outlets) on the control unit 120 that can be used to connect to individual high current loads (not shown in FIG. 1 but see FIG. 6) or to the tension bars 150, 154, 160, 170 via flexible cords 152, 156, 162, 172, respectively. Each extension bar 150, 154, 160, 170 includes multiple power outlets (e.g., AC power outlets) to locate the "fanning out" of the AC power closer to the load and eliminate multiple long runs of individual power cords. The power outlets may be any of numerous industry standard connector families or be short power leads that can connect directly to the load to eliminate the need for power cords. As will discussed with reference to FIG. 2, the extension bars 150, 154, 160, 170 are configured for mounting on corner supports of the rack 110 with clips or other brackets and may be mounted at user-selected heights to allow ready customization of the power distribution system 100 and to place the extension bars, and therefore power outlets, near to loads within the rack 110.

The number of extension bars 150, 154, 160, 170 may be four, as shown, or any other useful number (such as 1, 2, 3, 4, 5, or more) as long as the total current does not exceed the maximum allowable current draw or current rating of the control unit 120. Similarly, the number of power outlets can vary, and in one embodiment, 8 outlets are provided on each extension bar 150, 154, 160, 170, which provides 32 outlets (or support for 32 loads) with one control unit 120. A receptacle fan-out device 178 may be connected to an extension bar, such as bar 170, to enable additional loads to be supported by the power distribution assembly 110. The device 178 may be any accepted power supply device, such as typically plug-in outlet centers, power outlet strips, UPS products, and the like.

To fulfill this power supply or distribution function, numerous configurations can be used for the control unit 120 and converter 122 and for the extension bars 150, 154, 160, 170 (as well as the number of such bars or sticks). The embodiments may range from lower input power density (such as a 16 amp input with 1 or 2 expansion bars) up to high input power density (such as 3-phase input supporting up to 6 extension bars). With this broad range of inputs and outputs, the following are just a few exemplary (but not limiting) examples of how the power distribution function may be provided in a system 100. One embodiment is designed to connect low voltage (i.e., 100 to 127 AC voltage) power sources and/or directly into a facility outlet (i.e., power source 140) via cord 144 and a single input on unit 120 (such as a NEMA L5-30P or the like) and four outputs (such as four IEC320-C19 outlets at 12 amps each). This embodiment typically has a relatively low maximum current or current rating (such as 24 amps) with the output being up to 32 outlets such as 8 NEMA 5-15 or other outlets on the bars 150, 154, 160, 170 with maximum outlet and bar currents (such as 12 amp maximum per outlet and 12 amp maximum per bar).

In another embodiment of system 100, a higher input voltage (such as 200 to 240 AC voltage) is input via cord 144 from power source 140, which is typically the facility input, and having four outputs (such as four IEC320-C19 outlets at 12 amps each). In this embodiment, the maximum through current may again be set at 24 amps with each extension bar 150, 154, 160, 170 having up to 8 IEC 320 C-13 or other outlets with maximum outlet and total extension bar currents (such as 10 amps per outlet and 12 amps per bar). In another embodiment, the maximum current through the control unit 110 is set at 32 amps with single input (such as an IEC 309-32A) provided in the control unit 110 with four outlets for connecting to power supply cords 152, 156, 162, 170 and each extension bar 150, 154, 160, 170 having 8 outputs or outlets (such as 8 IEC 320 C-13 or similar outlets). In another example, the control unit 110 is designed to hard-wired via cord 144 to the power source 140 (such as the facility input or a high voltage UPS). The input connection on the unit 110 then may be a field wired terminal and the maximum current for the unit 110 may be higher, such as 40 amps and the input voltage higher, such as 200 to 240 volts AC. In this example, the extension bars 150, 154, 160, and 170 may not be identical with three having 8 outlets (such as 8 IEC 320 C-13 outlets with a maximum outlet current such as 10 amps) with a particular maximum bar current (such as 12 amps) and with the fourth bar having fewer outlets (such as 4) with but with higher current rating (such as 4 IEC 320 C-19 outlets having a 12 amp rating). In this manner, loads having differing power input requirements can be mounted within a single rack 110 and supplied power effectively with a control unit 120 with differently configured extension bars 150, 154, 160, 170. These are just a few examples of the configurations for the power distribution system 100 and are not intended to be limiting but to demonstrate the flexibility of the system 100 to distribute power at varying locations and to differing types of loads within the rack 110.

As shown, the control unit 120 includes an overload protector 124 and output circuit breakers 126 to more effectively provide the power distribution function in the system 100. More particularly, the overload protector 124 and output circuit breakers 126 provide input overcurrent protection, surge protection, and load segment output overcurrent protection. The overload protector 124 may be any device or circuit that, for example, disconnects the control unit 120 from the power source 140 when the current or voltage becomes excessive (over design limits for the control unit 120). The output circuit breakers 126 are provided to open the circuit to the outlet receptacles or connections to the extension bars 150, 154, 160, 170 via cords 152, 156, 162, 172, and the number and rating of the output circuit breakers 126 may vary to suit the allowable current in the bars 150, 154, 160, 170 (e.g., in 12 amp embodiments of the bars, 15 amp or smaller circuit breakers may be provided for each outlet receptacle in the control unit 120). Although not shown, the control unit 120 may include line fail-over switching devices or circuits along with multiple utility feeds for redundant power supply or source configurations (e.g., by adding an additional power source 140 and source line 144).

In addition to rack power distribution functions, the control unit 120 in some embodiments is configured to facilitate a number of remote monitoring and/or remote management or operation functions. Generally, such remote monitoring and monitoring functions may include load segment control (e.g., on/off control), automatic or manual staggered startup of each output from the control unit 120, line status monitoring, line voltage measurements, power consumption monitoring, and other desired management and monitoring functions. An operator or monitor can view the results of such monitoring and remotely operate the control unit 120 from remote monitoring and control node 190 (such as a typical computer device with I/O devices such as keyboards, graphical user interfaces, and the like, with a processor and memory, and a monitor). Operator node 190 is linked to the control unit 120 via the communication network 180, e.g., any digital data communications network, wired or unwired, such as the Internet, a local area network (LAN), a wide area network (WAN), and the like, and communication links 182 and 186. Alternatively, local management via the user node 190 may be provided with a direct connection (such as at a serial interface 132 at the control unit 120 to monitoring and/or management cards in the unit 120).

A communication interface 132 is provided at the control unit 120 to handle input and output functions and to facilitate communication with the user node 190. For example, the communication interface 132 may be a Web or Internet Protocol (P) interface and the user node 190 may include a Web browser for accessing and communicating with the communication interface 132. Communications over the network 180 can be implemented using simple network management protocol (SNMP) or other useful protocols that facilitate management applications (such as those that would be operating on node 190) to query or command management agents on the control unit 120 (such as those embodied in the remote monitoring unit 128 and/or the remote management unit 130).

The remote monitors unit 128 is provided to monitor a number of parameters during the operating of the control unit 120. For example, the remote monitoring unit 128 may include measurement sensors for sense line voltages at outlets or in lines 152, 156, 162, 172 to extension bars 150, 154, 160, 170 and in response, to communicate or transmit a signal(s) to the remote monitoring and management node 190 via communication interface 132. Sensors may also be provided to measure line status or on/off status of the lines 152, 156, 162, 172 and power consumption on these lines 152, 156, 162, 172 to measure operations at the extension bars 150, 154, 160, 170 and connected loads or rack equipment. Again, these operating measurements are communicated to the node 190 via the communication device 132.

The remote management unit 130 provides operating management functions for the control unit 120 including local (or automatic control) and remote control functions including distributing power in response to commands from the node 190 (or at an interface on the unit 120 (not shown)). The automatic controls may include staggered setup of each output or extension bar 150, 154, 160, 170. The remote management features may include intelligent segment control such as remotely providing or terminating power to one or more of the extension bars 150, 154, 160, 170. More specifically, the remote management commands for the outlets may include configuration of each of the outlets of the control unit 120 (such as via SNMP and interface 132), immediate on, sequenced on, delayed on, immediate off, and reboot (e.g., turning an outlet off and then back on immediately or with delays). Shutdown commands may also be issued to the control unit 120 to turn off all outlets. Other useful management commands may be issued by the node 190 and processed by the remote management unit 130, such as a cancel command to stop action on the most recent command and an override command to cancel a previous command and replace it with a new command.

Figure 2:
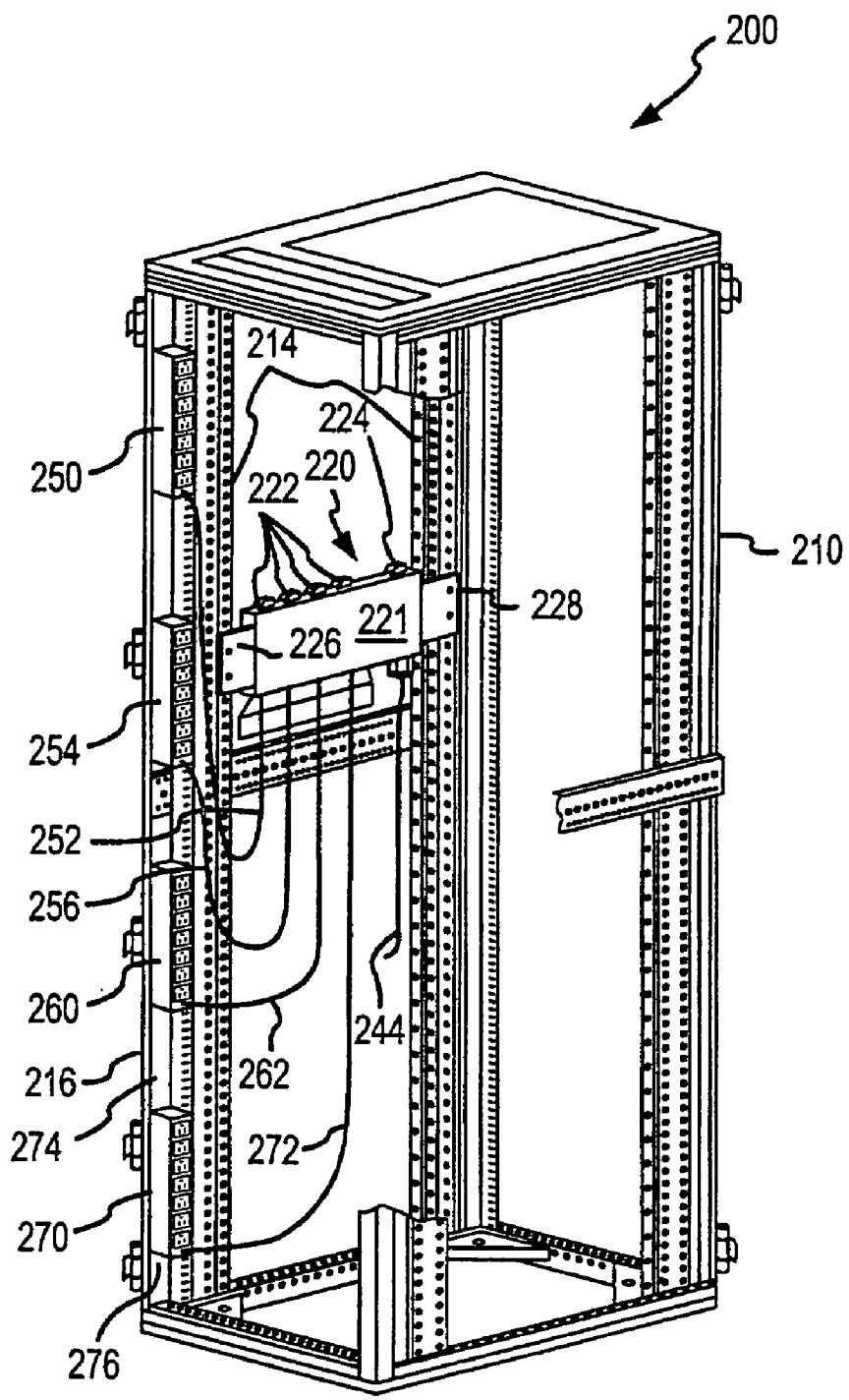
FIG. 2 is a partial perspective view of one embodiment of a modular power distribution system, similar to FIG. 1, installed in a typical equipment rack or cabinet showing the side mounting arrangement of the core or control unit.

FIG. 2 illustrates one physical implementation and mounting arrangement for a modular power distribution system in a rack As shown, a modular power distribution system 200 is installed in a rack 210 in the vertical or OU-mounting arrangement to limit the amount of rack U-space being used by the system 200 (e.g., to consume no or very little rack U-space). The rack 210 is a standard equipment rack with side walls having a row or strip 216 of mounting slots 216 and with corner supports 214 also including mounting holes or slots. As shown, the control unit 220 has its substantially planar housing 221 arranged vertically (i.e., with a plane passing through the housing being substantially parallel to the side walls of the rack 210). Mounting brackets or clips 226, 228 are provided on the ends of the housing 221 of the control unit 220 for rigidly clipping to or mating with the holes or slots in the corner supports 214. While shown in a generally upper position within the mack or cabinet 210, the control unit housing 221 can be mounted at any useful position or height within the rack 210. Outlet on/off switches 222 are provided on the housing 221 and a control unit on/off switch 224 is also included to allow local, manual control of the power distribution to the outlets of the housing 221 to which the power supply cords 252, 256, 262, and 272 are connected at housing 221. Power is supplied to the control unit 220 via inlet power cord 244 which is connected to a power source or supply (not shown) external to the rack 210.

The illustrated system 200 fans out power distribution within the rack 210 by including four power extension bars 250, 254, 260, 270 that are connected to control unit 220 with power supply cords 252, 256, 262, 272. The power extension bars 250, 254, 260, 270 may be configured similarly to the bars 150, 154, 160, 160 with similar maximum currents, with outlets or receptacles (such as with 8 outlets or receptacles as shown) or cord segments, and other described features. The bars 250, 254, 260, 270 can be mounted at any position or height within the rack 210 (typically, adjacent planned loads or equipment positions on the shelves). The configuration of the bars 250, 254, 260, 270 allows mounting within the rack 210 without consuming rack U-space as the bars 250, 254, 260, 270 have generally square or rectangular cross sections that are similar in size to the corner supports 214, such that the bars 250, 254, 260, 270 either extend only slightly beyond the corner supports 214, are coplanar, or are actually recessed from the surfaces of the corner supports 214. As shown for bar 270, mounting clips or brackets 274, 276 are provided on the ends of the bar 270 for rigidly mounting the bar 270 to the row 216 of mounting holes or slots on the side wall of the rack 210, which provides flexibility in the positioning of the bar 270 at nearly any position within the rack 210. As shown, cable management is significantly improved with only four short supply cables 252, 256, 262, 272 being used to supply 32 outlets (at least in this embodiment) from which 32 loads can be supplied with relatively short jumpers.

Figure 3:
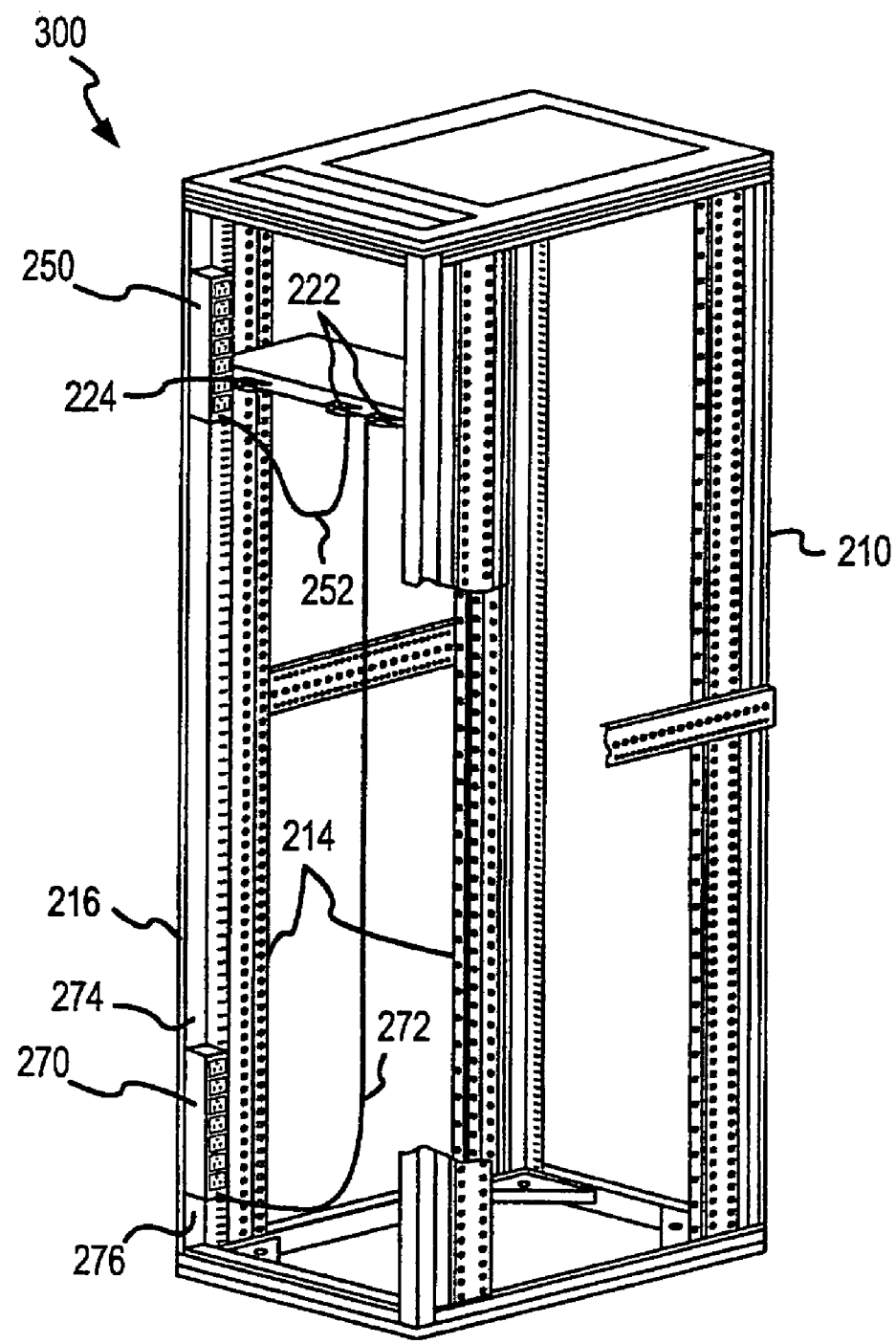
FIG. 3 is a perspective view similar to that of FIG. 2 illustrating another embodiment of a modular power distribution system showing the "1U" or horizontal mounting arrangement of the core or control unit.

FIG. 3 illustrates some of the mounting and configuration flexibility provided by the modular power distribution systems of the invention A power distribution system 300, with several similar components, is shown installed in the rack 210. As shown, the housing 221 of the control unit 220 is mounted horizontally in the rack 210 with mounting clips 226, 228 being used to mount the housing 221 to corner supports 214. The housing 221 is relatively thin so as to take up as little rack U-space as possible while still providing desired functions (such as 1U, 0.5U, or less thickness). In one embodiment, the housing 221 is about 17.5 inches by about 1.62 inches by about 13 inches (width by height or thickness by depth). The depth may be maintained at less than half the depth of the rack 210 to allow two control units 220 to be mounted back to back, horizontally, which is useful in modular power distribution systems that utilize two control units 220 to distribute power in a rack 210. Alternatively, when two units 220 are installed in a single rack 210, the units 220 may be mounted adjacent to each other but top to bottom or be mounted in a spaced apart fashion at two differing locations within the rack 210. In the system 300, only two extension bars 260, 270 are provided and are attached to the control unit 220 by cords 262, 272, respectively. Of course, more or fewer extension bars may be utilized in the system 300 (or in system 200).

Figure 4:
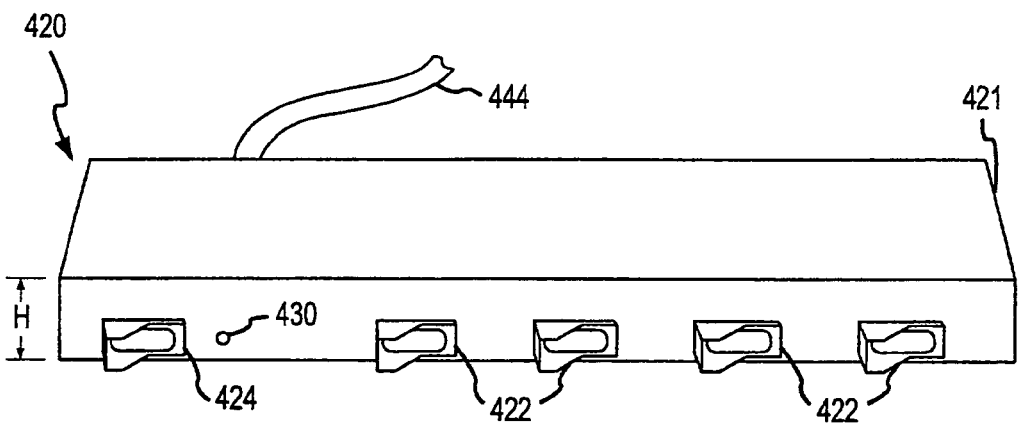
FIG. 4 is a front perspective view of a core unit, as would be used in the systems of FIGS. 1–3.
Figure 5:
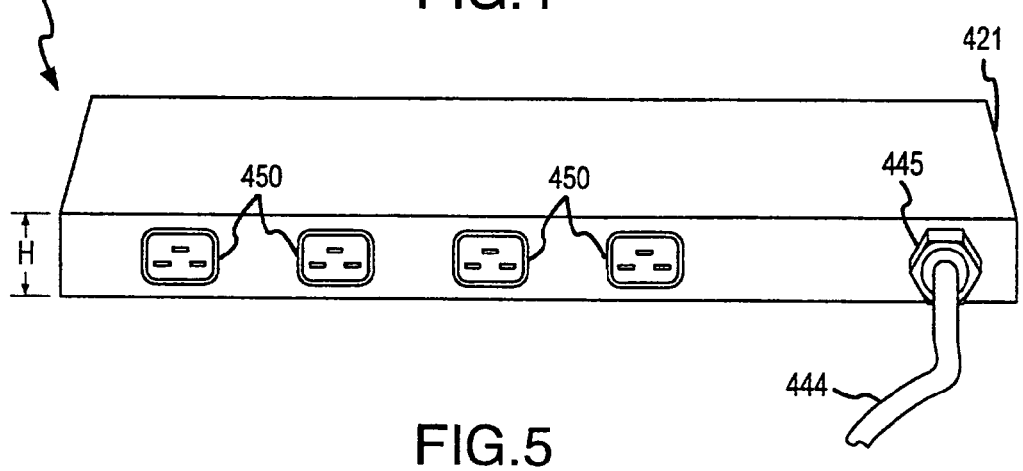
FIG. 5 is a rear perspective view of the core unit of FIG. 4.

FIGS. 4 and 5 illustrate one embodiment for a control core unit 420 (such as would be used in systems 100, 200, and 300). As shown, the control unit 420 includes a housing 421 that is rectangular in shape and has a thickness or height, H that is selected to allow the control unit 420 to be mounted either in a vertical or horizontal mounting (as described in FIGS. 2 and 3) without requiring much if any rack U-space. In most embodiments, the thickness or height, H, is less than or equal to about 1U and in some embodiments is less than about 0.5U to allow stacking of 2 control units on a single shelf The thinness of the housing 421 enables 1U or less horizontal mounting, which leaves desirable rack U-space for other equipment in a rack.

As shown, a main ON/OFF switch 424 is provided for shutting down the control unit 420 along with a main indicator light 430 for indicating when power is provided to the unit 420 and when the switch 424 is placed in the ON position An outlet switch or circuit breaker (such as a 15 amp circuit breaker) 422 is provided for each power outlet of the unit 420 (in this case 4 outlet switches 422 are provided to control, and in the case of circuit breakers to overcurrent and surge protect, outlets 450). Although not shown, indicator lights may be provided for each of the outlet switches 422. Power is supplied to the control unit 420 by an attached input power cord (which may, in some embodiments, be replaced by hard wiring directly to a facility input) 444 which is connected to the housing 421, such as by a protective earth bonding screw 445. The power cord 444 is also attached to a power source or supply (such as a facility AC power source). Power outlets 450 are provided to allow connection with standard power cords to extension strips or bars, and the number and type of outlets 450 may be varied to practice the invention. As shown, four outlets 450 (such as 4 IEC C19 outlets) are provided to support power distribution to up to four extension bars. In remote monitoring and/or management embodiments (such as that shown in FIG. 1), a plug-in for an interface connection is provided for a communication signal cable to a network and/or remote monitoring and control node, e.g., a SNMP or other connection.

Figure 6:
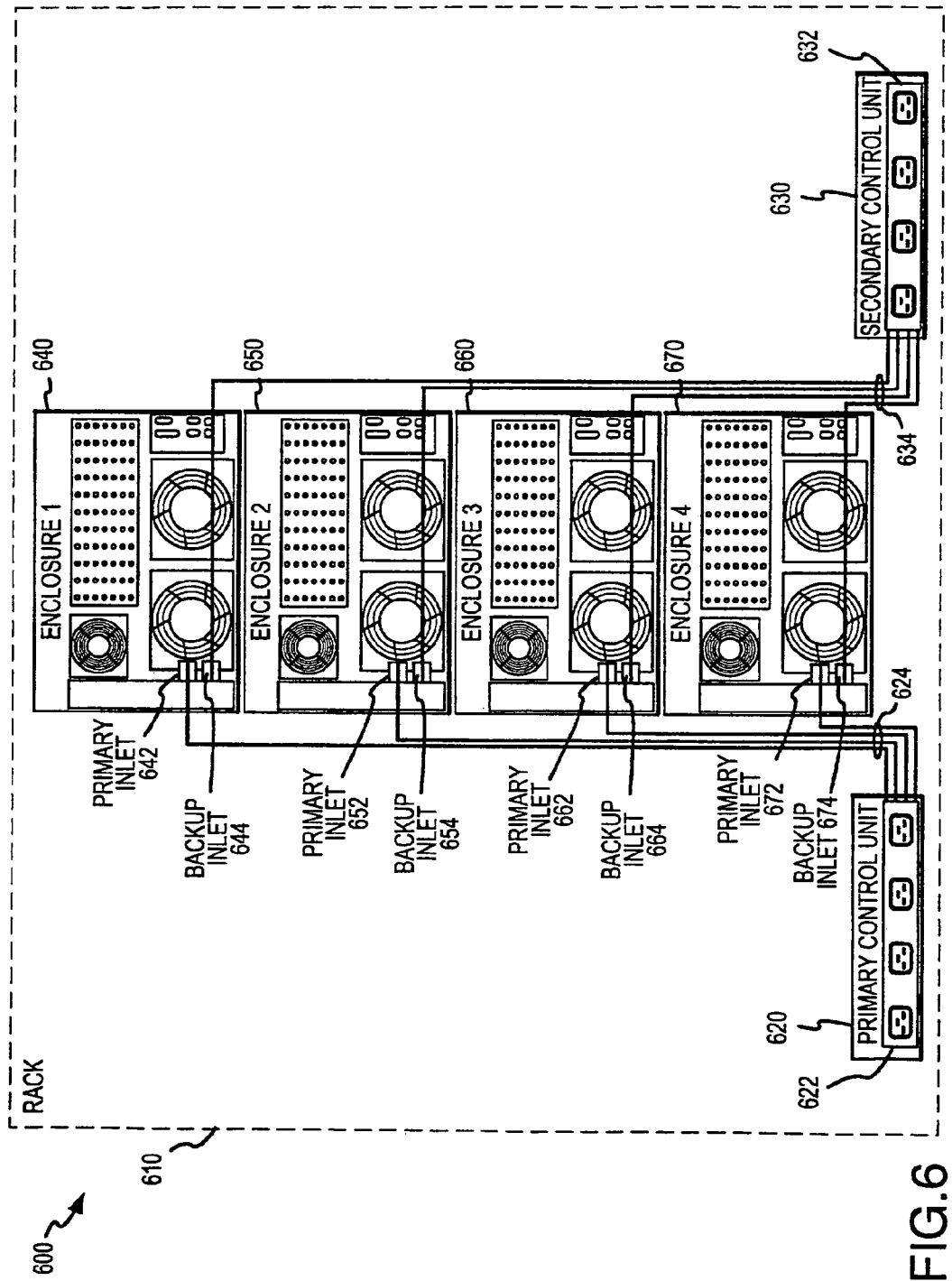
Figure 7:
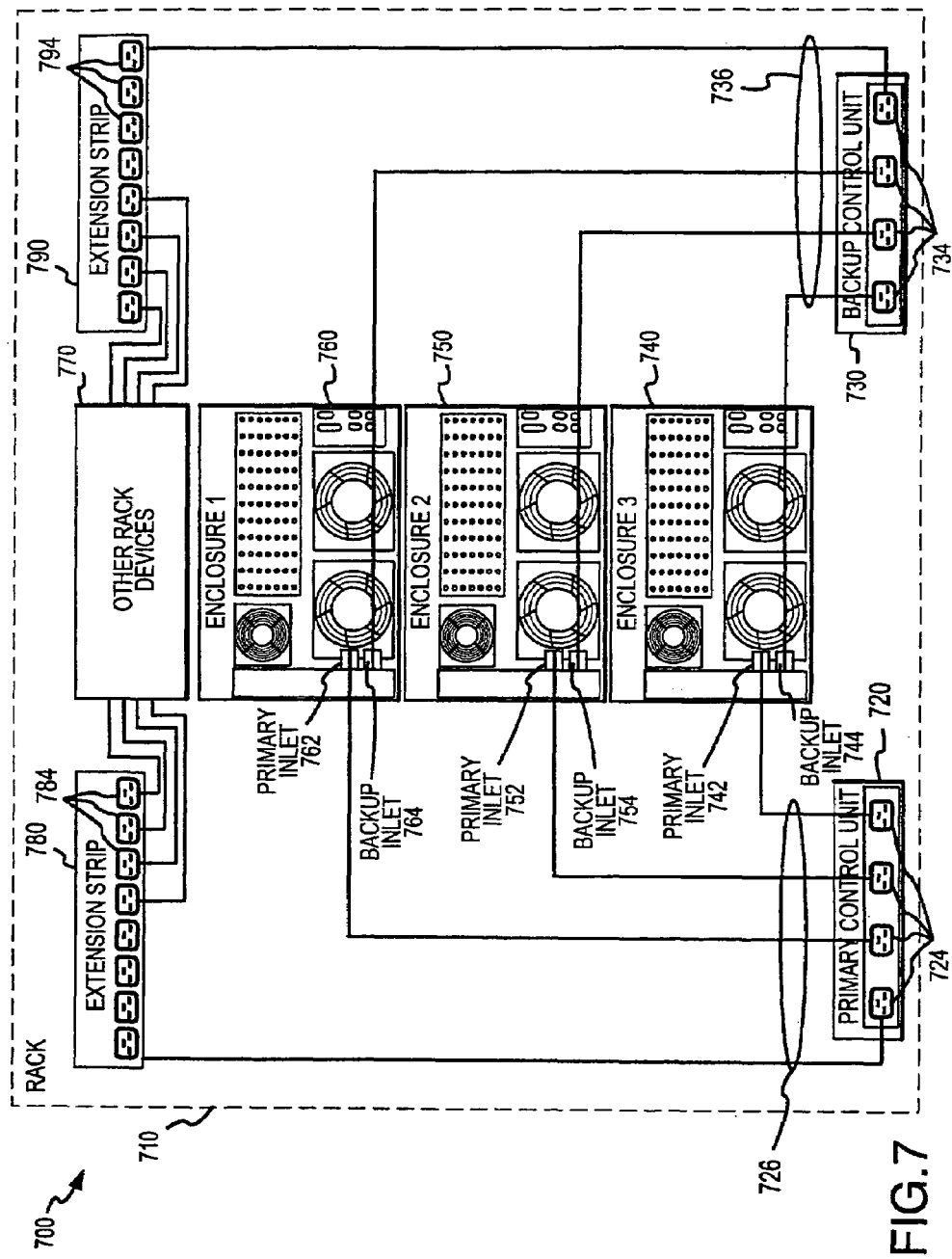
FIG. 7 is a functional block diagram similar to FIG. 6 illustrating the use of a pair of modular power distinction unit of the invention to distribute power to three enclosures, similar to FIG. 6, but also providing a number of other rack options or devices.

FIGS. 6 and 7 illustrate two power distribution systems 600 and 700 that illustrate the flexibility of the invention in allowing a user to configure power distribution in differing, modular ways to meet their rack power needs. In a rack in the data storage and other industries, a typical power system block diagram may call for a primary and a backup AC input to three, four, or more high current loads.

In FIG. 6, two control units 620 and 630 without extension bars are used to provide the AC transfer switch function or power distribution (from primary and backup power sources not shown) to the loads. As shown, a modular power distribution system 600 includes a rack 610 in which a primary control unit 620 and a backup control unit 630 are mounted (either vertically or horizontally at a desired height in the rack 610). Four enclosures (such as servers or other computing or data storage device) 640, 650, 660, 670 are also mounted in the rack 610 and are configured for redundant power supplies with primary and backup inlets 642, 644, 652, 654, 662, 664, 672, 674, respectively. During normal operations, the primary control unit 620 distributes power to the enclosures 640, 650, 660, 670 via power supply cords 624 that are connected individually to the power outlets 622 of the primary control unit 620 and to the primary inlets 642, 652, 662, 672. The backup control unit 630 supplies backup power via power supply cords 634 that are connected individually to the outlets 632 and the backup inlets 644, 654, 664, 674 on the enclosures 640, 650, 660, 670.

An alternate modular power distribution system 700 is shown in FIG. 7 that demonstrates how the combined use of control units with extension bars is useful for fanning out pluggable or other power supplies within a rack without cable confusion or loss of rack U-space. As shown, the system 700 includes a rack 710 in which three enclosures, such as high current loads including servers and the like, 740, 750, 760 are mounted along with a number of other rack devices 770. The high current loads 740, 750, 760 are provided redundant power directly from a primary control unit 720 and a backup control unit 730. This is achieved by connecting primary inlets 742, 752, 762 via cables 726 to outlets 724 on the primary control unit 720 and by connecting backup inlets 744, 754, 764 via cables 736 to outlets 734 on the backup control unit 730.

Significantly, the other rack devices 770 are also provided redundant power via extension strips 780 and 790 that are connected via cables 726, 736 to outlets 724, 734 on primary and backup control units 720, 730. The extension strips 780 and 790 have outlets 784, 794 (such as 8 outlets or receptacles) that are then connected by jumpers or hard wiring to the other rack devices 770. Through the use of extension strips 780, 790, a number of enclosures 740, 750, 760 and other rack devices 770 can be powered from one or two control units 720, 730 with minimal cables, with reduced cable run lengths, and with increased available rack U-space (as the control units 720, 730 can be vertically mounted in a OU mounting or horizontally mounted in a 1U or less mounting and as the extension strips 780, 790 are corner mounted so as to not use an rack U-space).

As can be appreciated, the modular characteristics of the combined use of a core control unit with one or more sticks or strips significantly enhances flexibility in growth (e.g., larger capacity and/or more features) and provides simplified maintainability. Regarding flexibility, once a power distribution system is installed a user is able to upgrade the features and/or capacity in the control unit by simply replacing the unit without modifying or replacing other portions of the system, such as the extension strips which can remain in place connected to their loads. The extension strips or sticks can be unplugged from the core or control unit and the control unit can be replaced with a control unit of greater capacity (e.g., a 16 amp unit can be upgraded or changed to a 24, 32, or 40 amp core or vice versa) or a control unit with more or different control or power distribution features or functionality, such as one with remote monitoring and management features. In contrast, existing power distribution systems typically require replacement of the entire power distinction system and wiring the new system. Maintainability is improved because a defective part can simply be replaced without disturbing other components of the power distribution systems of the present invention. For example, if an extension slick becomes defective, only that extension stick needs to be replaced or paired and if a core maintains, the core can be readily replaced without the need for rewiring power distribution to loads or to the sticks.

Although the invention has been described and illustrated with a certain degree of particularity, the present disclosure has been made only by way of example and that numerous changes in the combination and arrangement of parts can be resorted to by those skilled in the art without departing from the spirit and scope of the invention. A system according the invention, such as system 100 of FIG. 1, may include 2 or more control units within a single rack 110 each connected to extension bars to quickly increase the number of power outlets within a rack, to increase the modularity of power distribution control and distribution, and to allow differing loads to be powered within a single rack (i.e., through the use of 2 different control units with different output characteristics). In some embodiments of the invention, a single type of extension bars is utilized while in some arrangements it is useful to provide 2 or more differing extension bars, such as extension bars with different numbers and/or types of outlets or including cord segments for supplying power to various loads in a rack. While specific voltages and/or currents have been described, the modular power distribution system are by nature voltage independent and worldwide compatible. The power distribution system typically conforms with power distribution industry standards, e.g., conform to standards such as the National Electrical Code (e.g., NFPA 70) and the Standard for Safety of Information Technology (e.g., UL 1950, Standard for Safety of information Technology Equipment, and/or IEC950).

I claim:

1. A power distribution system for distributing power to electrical or computer equipment mounted within an equipment rack, comprising:
   a control unit mounted within the rack including a power input for receiving power from a power source located outside the rack, a power converter for converting the received power to an output electrical power, and a plurality of power outlets for providing an electrical connection to the control unit and outputting the output electrical power;
   an extension bar mounted within the rack and having an electrical power input for input of electrical power to the extension bar and a plurality of power outlets adapted to couple with and distribute electrical power to conducting elements that electrically connect the extension bar to the mounted equipment; and
   an electrical power cable connected to one of the power outlets in the control unit and to the electrical power input of the extension bar.

2. The system of claim 1, wherein the control unit includes a housing to which the control unit power outlets are mounted and brackets connected to ends of the housing configured for supporting the housing at a selectable height within the equipment rack, whereby OU of rack U-spacing in the equipment rack is utilized by the housing.

3. The system of claim 1, wherein the control unit includes a housing to which the control unit power outlets are mounted and brackets connected to the housing configured for supporting the housing in a horizontal position and wherein the housing has a thickness of less than about 1 U.

4. The system of claim 1, farther including a second extension bar within the rack having an electrical power input for input of electrical power to the second extension bar and a plurality of power outlets adapted to couple with and distribute electrical power to conduction elements that electrically connect the second extension bar to the mounted equipment.

5. The system of claim 4, wherein the power outlets of the second extension bar differ firm the power outlets of the extension bar.

6. The system of claim 1, wherein the control unit includes overload protection and an output circuit breaker for each of the power outlets in the control unit.

7. The system of claim 1, wherein the control unit includes a network communication interface and is communicatively linked In a remote monitoring and management node via a communication network and the communication interface.

8. The system of claim 7, wherein the control unit includes a monitoring system for sensing operating parameters for the control unit and in response, transmitting monitoring signals to the remote monitoring and management node.

9. The system of claim 8, wherein the operating parameters are selected firm the group consisting of output line status, power consumption at the power outlets, and output line voltage.

10. The system of claim 7, wherein the control unit includes a management system responsive to command signals from the remote monitoring and management node to operate the control unit including selective power distribution to the power outlets.

11. A power distribution system for mounting within an equipment rack to distribute electrical power to devices mounted within the equipment rack from an electrical power source external to the equipment rack, comprising:
   an elongate first extension bar having a power inlet and a plurality of power output connectors adapted to couple with electrical conductor elements that electrically connect each of the power output connectors with one of the mounted devices;
   an elongate second extension bar having a power inlet and a plurality of power output connectors adapted to couple with additional ones of the electrical conductor elements that electrically connect each of the power output connectors with one of the mounted devices;
   a control unit mounted within the rack including a power input for receiving power from the external power source and a plurality of power output connectors to output the received power and to couple with electrical conductor elements that electrically connect a first one of the power output connectors with the power inlet of the first extension bar and a second one of the power output connectors with the power inlet of the second extension bar.

12. The system of claim 11, wherein the control unit includes a housing with means for rigidly mounting the housing within the rack.

13. The system of claim 11, wherein the control unit has a current rating selected from the range of about 16 amps to about 40 amps.

14. The system of claim 11, wherein first and second extension bars include at least six of the power output connectors.

15. The system of claim 11, further including a third and a fourth extension bar each having a power inlet and a plurality of power output connectors adapted to couple with additional ones of the electrical conductor elements that electrically connect each of the power output connectors with one of the mounted devices and further including means for mounting the second extension bar in a second position within the rack and each having their power inlets connected via an electrical conductor element to one of the power output connectors of the control unit.

16. The system of claim 11, wherein the control unit includes a network communication interface and is communicatively linked to a remote monitoring and management node via a communication network and the communication interface.

17. The system of claim 16, wherein the control unit includes a monitoring system for sensing operating parameters for the control unit and in response, transmitting monitoring signals to the remote monitoring and management node.

18. The system of claim 17, wherein the operating parameters are selected from the group consisting of output line status, power consumption at the power outlets, and output line voltage.

19. The system of claim 16, wherein the control unit includes a management system responsive to command signals from the remote monitoring and management node to operate the control unit including selective power distribution to the power outlets.

20. A power distribution system, comprising:
   a control unit mounted proximate a rack including a power input for receiving power from a power source located outside the rack, a power converter for converting the received power to an output electrical power, and a plurality of power outlets for providing an electrical connection to the control unit and outputting the output electrical power;
   an extension means mounted proximate the rack and having an electrical power input for input of electrical power to the extension means and a plurality of power outlets adapted to couple with and distribute electrical power to conducting elements that electrically connect the extension means to the mounted equipment; and
   an electrical power cable connected to one of the power outlets in the control unit and to the electrical power input of the extension means.

* * * * *

UNITED STATES PATENT AND TRADEMARK OFFICE
CERTIFICATE OF CORRECTION

PATENT NO.        : 7,215,535 B2
APPLICATION NO.   : 10/995737
DATED             : May 8, 2007
INVENTOR(S)       : Robert A. Pereira It is certified that error appears in the above-identified patent and that said Letters Patent is hereby corrected as shown below:

In column 1, line 26, delete "encloses" and insert -- enclosures --, therefor.

In column 1, line 38, delete "makers" and insert -- manufacturers --, therefor.

In column 1, line 41, delete "urged" and insert -- arranged --, therefor.

In column 2, line 29, delete "Le.," and insert -- i.e., --, therefor.

In column 2, line 53, delete "this" and insert -- thin --, therefor.

In column 2, line 53, delete "orb" and insert -- or brackets --, therefor.

In column 3, line 24, delete "hardened" and insert -- hardwired --, therefor.

In column 4, line 2, delete "distinction" and insert -- distribution --, therefor.

In column 4, line 51, delete "form any" and insert -- for many --, therefor.

In column 4, line 55, delete "distinction" and insert -- distribution --, therefor.

In column 4, line 57, delete "cool" and insert -- control --, therefor.

In column 4, line 67, delete "bits" and insert -- brackets --, therefor.

In column 5, line 13, delete "removed" and insert -- received --, therefor.

In column 5, line 15, delete "converter 22" and insert -- converter 122 --, therefor.

In column 5, line 23, delete "tension" and insert -- extension --, therefor.

In column 5, line 50, after "any" insert -- industry --.

In column 7, line 5, delete "monitoring" and insert -- management --, therefor.

In column 7, line 29, delete "(P)" and insert -- (IP) --, therefor.

In column 7, line 39, delete "monitors" and insert -- monitoring --, therefor.

In column 7, line 52, delete "device" and insert -- interface --, therefor.

UNITED STATES PATENT AND TRADEMARK OFFICE
CERTIFICATE OF CORRECTION

PATENT NO. : 7,215,535 B2
APPLICATION NO. : 10/995737
DATED : May 8, 2007
INVENTOR(S) : Robert A. Pereira It is certified that error appears in the above-identified patent and that said Letters Patent is hereby corrected as shown below:

In column 7, line 58, delete "setup" and insert -- startup --, therefor.

In column 8, line 25, delete "mack" and insert -- rack --, therefor.

In column 9, lines 12-13, delete "Alteratively" and insert -- Alternatively --, therefor.

In column 9, line 21, after "control" insert -- or --.

In column 11, line 3, delete "distinction" and insert -- distribution --, therefor.

In column 11, line 7, delete "slick" and insert -- stick --, therefor.

In column 11, line 8, delete "paired" and insert -- repaired --, therefor.

In column 11, line 9, delete "maintains" and insert -- malfunctions --, therefor, In column 12, line 3, in Claim 4, delete "farther" and insert -- further --, therefor.

In column 12, line 11, in Claim 5, delete "firm" and insert -- from --, therefor.

In column 12, line 18, in Claim 7, delete "In" and insert -- to --, therefor.

In column 12, line 27, in Claim 9, delete "firm" and insert -- from --, therefor.

Signed and Sealed this

Twenty-fourth Day of November, 2009

David J. Kappos
*Director of the United States Patent and Trademark Office*